United States Patent
Lai

(10) Patent No.: US 6,239,043 B1
(45) Date of Patent: May 29, 2001

(54) METHOD FOR MODULATING UNIFORMITY OF DEPOSITED LAYER THICKNESS

(75) Inventor: Yeong-Chih Lai, Nan-Tao (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/476,519

(22) Filed: Jan. 3, 2000

(51) Int. Cl.$^7$ ........................................ H01L 21/31
(52) U.S. Cl. ........................ 438/782; 438/743; 438/778
(58) Field of Search ................................ 438/782, 778, 438/779, 784, 743, 692, 697, 631

(56) References Cited

U.S. PATENT DOCUMENTS 6,036,781 * 3/2000 Ahn et al. .

* cited by examiner

Primary Examiner—David Nelms
Assistant Examiner—Dung Ale

(57) ABSTRACT

The present invention is used to modulate uniformity of deposited layer thickness, and especially is related to the layer that is formed by chemical vapor deposition. The proposed method of the invention comprises following essential steps: Place a wafer on a wafer carrier; move the wafer carrier under a shower head inside a reactor; adjust a tilted angle between the shower head and the wafer; perform a depositing process to form a deposited layer on the wafer; and move the wafer carrier away from the shower head. The proposed apparatus of the invention comprises following essential elements: A reactor where a depositing process is performed; a wafer carrier for holding and positioning the wafer; a shower head for showering a plurality of reacting elements on the wafer, where the shower head is located over the wafer when a depositing process is performed; a plurality of stretch devices for connecting the shower head to an immobile structure, where these stretch devices are stretched or shrunk individually to adjust a distance (or a tilted angle) between the shower head and the wafer; and a plurality of reacting devices to perform the depositing process and form a deposited layer on the wafer.

17 Claims, 5 Drawing Sheets

METHOD FOR MODULATING UNIFORMITY OF DEPOSITED LAYER THICKNESS

BACKGROUND OF THE INVENTION

1. Field of the Invention

This invention relates to a method and apparatus for modulating uniformity of deposited layer thickness. Particularly, this invention is used to overcome a conventional deficiency that the thickness of a deposited layer is non-uniform, which is more serious for plasma enhanced chemical vapor deposition.

2. Description of the Prior Art

Deposition is an important fabricating process for contemporary semiconductor fabrication. Deposition may be in the form of physical vapor deposition which usually is used to form a metal layer or chemical vapor deposition which usually is used to form both a conductor layer and a dielectric layer. Because formation of a layer on a wafer is a basic step of semiconductor fabrication, especially in the formation of a uniform layer for a multi-layers structures, the value of deposition is abidingly increased and it is desired to improve contemporary deposition technology.

The familiar depositing reactor includes single wafer type and batch type, where only one wafer is placed inside the reactor for the former process but several wafers are placed inside the reactor for the latter process. Moreover, for the conventional depositing reactor, reacting elements, such as gases, are transported into the reactor through some holes formed in the walls of the reactor, and the wafer(s) reacts with imported reacting elements to form a deposited layer on the wafer(s). Obviously, because reacting elements do not react with the wafer(s) totally, it is desired to improve efficiency of deposition by directly exposing the wafer(s) under the reacting elements by a shower head that is located inside the reactor and over the wafer(s). To compare with old way that reacting elements only are transported into the reactor, application of a shower head is significantly efficient for most of reacting elements to react with wafer(s) before they flow to other parts of the reactor, and then efficiency of the depositing process is properly improved.

The relation between the shower head and the wafer is briefly illustrated in FIG. 1A, where a qualitative cross-sectional view is provided. As FIG. 1A shows, shower head 10 is over wafer 11 that is held by a wafer carrier and usually is over a heater block, and the shower head is connected to immobile structure 12, such as a wall of the reactor, by several stretch devices 13. Additionally, for current depositing apparatus for which the shower head(s) is used, shower head 10 is parallel to wafer 11. Moreover, in order to precisely control the depositing process, stretch devices 13 can move, extend or shrink together to adjust both the distance and the relative direction between wafer 11 and shower head 10. Herein, FIG. 1B illustrates this case in demonstrating how the relative direction between wafer 11 and shower head 10 is modified, and FIG. 1C and FIG. 1D illustrate theses cases where the direction between wafer 11 and shower head 10 are modified. Herein, the former figure illustrates the case where the distance is decreased and the latter illustrates the case where the distance is increased.

However, an unavoidable deficiency of deposited layer is failure to achieve total uniformity, where the deposited layer is thicker on one side of wafer 11 and is thinner on another side of wafer 11. Herein, non-uniformity of the deposited layer depends on the material of the deposited layer and the variety of the performed depositing process. The deficiency is more obvious and serious for chemical vapor deposition, especially for plasma enhanced chemical vapor deposition, and the deficiency also is more serious and obvious when material of the deposited layer is dielectric, especially for oxide and silicon nitride. Significantly, the deficiency will produce some troubles for the following fabrication process such as photolithography and etching, and the deficiency also decreases the quality of all chips on wafer 11 for wafers on different part of wafer 11 corresponds to different thickness of the deposited layer.

Furthermore, the non-uniform degree of thickness of the deposited layer is dependent on the configuration of the reactor. This can be understood by the following briefly-described result. Whenever configuration of the reactor is not symmetrical or shower head 10 is not located in the center of the reactor, it is natural that the reacting environment is not symmetrical for wafer 11 that the deposited layer is formed, even if the shower head 10 is directly located over it. Thus, these reacting particles are not uniformly distributed on wafer 10. A direct result is the thickness of the deposited layer is not uniform.

Therefore, according to the previous discussion, in order to improve the quality of deposition, it is desired to overcome the deficiency of non-uniform thickness. Moreover, owing to the fact that the configuration of the reactor is complicated and thus it is difficult to provide perfectly symmetrical reacting environment for each wafer that is deposited, it also is desired to provide a simple and practical way to overcome this deficiency.

SUMMARY OF THE INVENTION

A primary object of the present invention is to provide a method to modulate uniformity of deposited layer thickness, especially in the layer formed by plasma enhanced chemical vapor deposition.

An additional object of the present invention is to provide an apparatus that modulates uniformity of the deposited layer thickness, especially the layer formed by chemical vapor deposition.

A further object of the present invention is to overcome the obvious defect of conventional deposition process where the thickness of the deposited layer is non-uniform, especially when the reacting environment, such as the geometry of the reactor, is not symmetrical for a wafer.

Another object of the present invention is to provide a practical method and a simple apparatus to enhance uniformity of deposited layer thickness.

One essential embodiment of the invention is a method for modulating uniformity of deposited layer thickness. The proposed method comprises the following essential steps: place a wafer on a wafer carrier; move the wafer carrier under a shower head, wherein the shower head is inside a reactor; adjust a tilted angle between the shower head and the wafer; perform a depositing process to form a deposited layer on the wafer; and move the wafer carrier away from the shower head.

Another essential embodiment of the invention is an apparatus for modulating uniformity of deposited layer thickness. The proposed apparatus comprises following essential elements: A reactor where a depositing process is performed; a wafer carrier for holding and positioning the wafer; a shower head for showering a plurality of reacting elements on the wafer, where the shower head is located over the wafer when a depositing process is performed; a plurality of stretch devices for connecting the shower head to an immobile structure, where these stretch devices are stretched or shrunk individually to adjust a tilted angle between the shower head and the wafer; and a plurality of reacting devices to perform the depositing process and form a deposited layer on the wafer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 1A to FIG. 1D briefly illustrate the relation between a shower head and a wafer according to well-known technology, wherein FIG. 1A is a general illustration and FIG. 1B to FIG. 1D illustrate some variations of the distance and relative direction between the wafer and the shower head;

DESCRIPTION OF THE PREFERRED EMBODIMENT

Figure 1A:
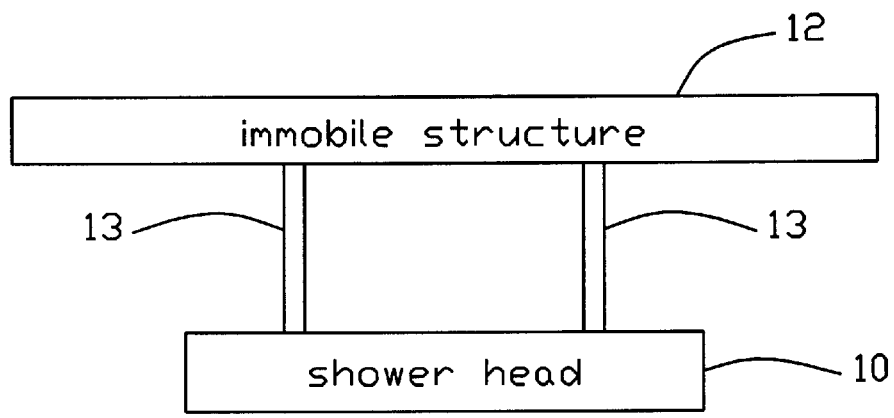
Figure 1B:
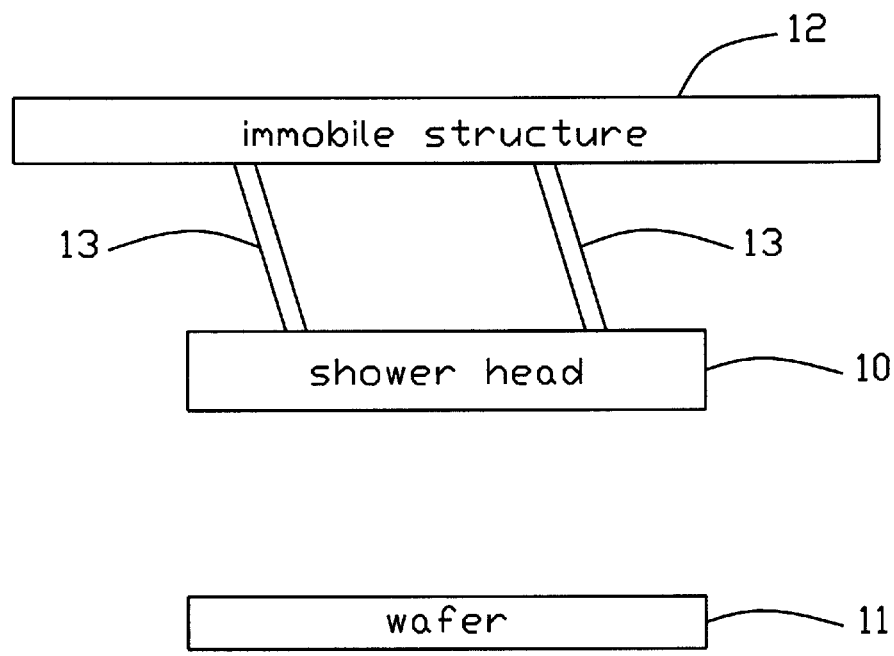
Figure 1C:
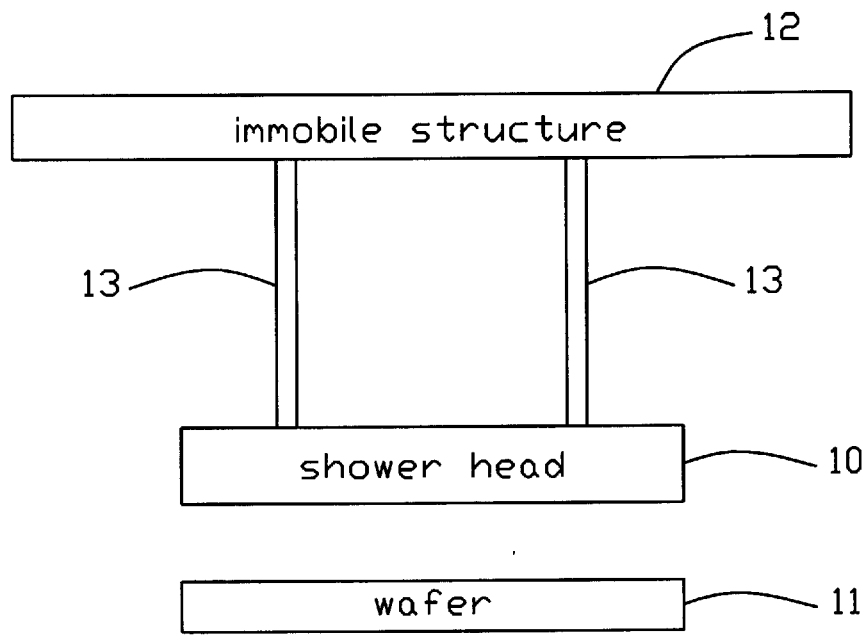
Figure 1D:
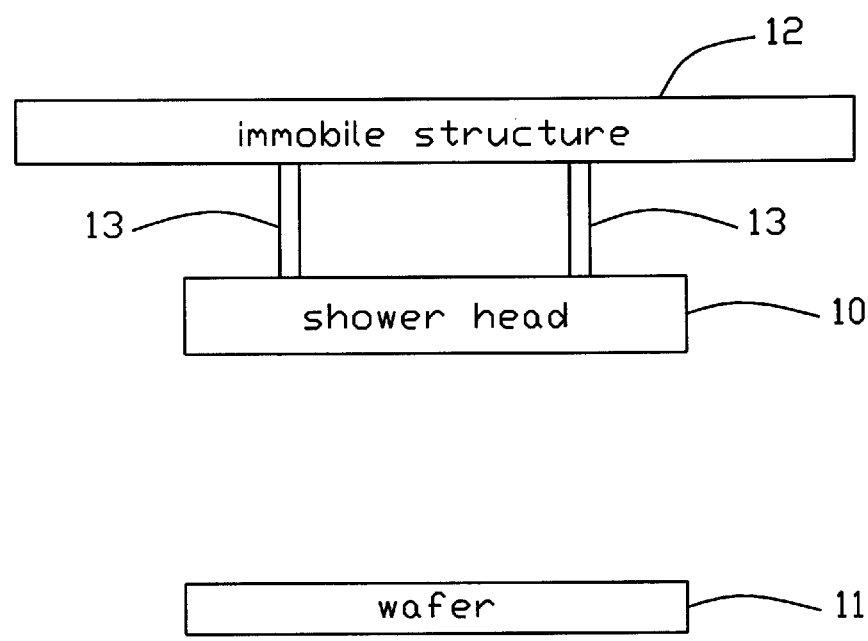
Figure 2:
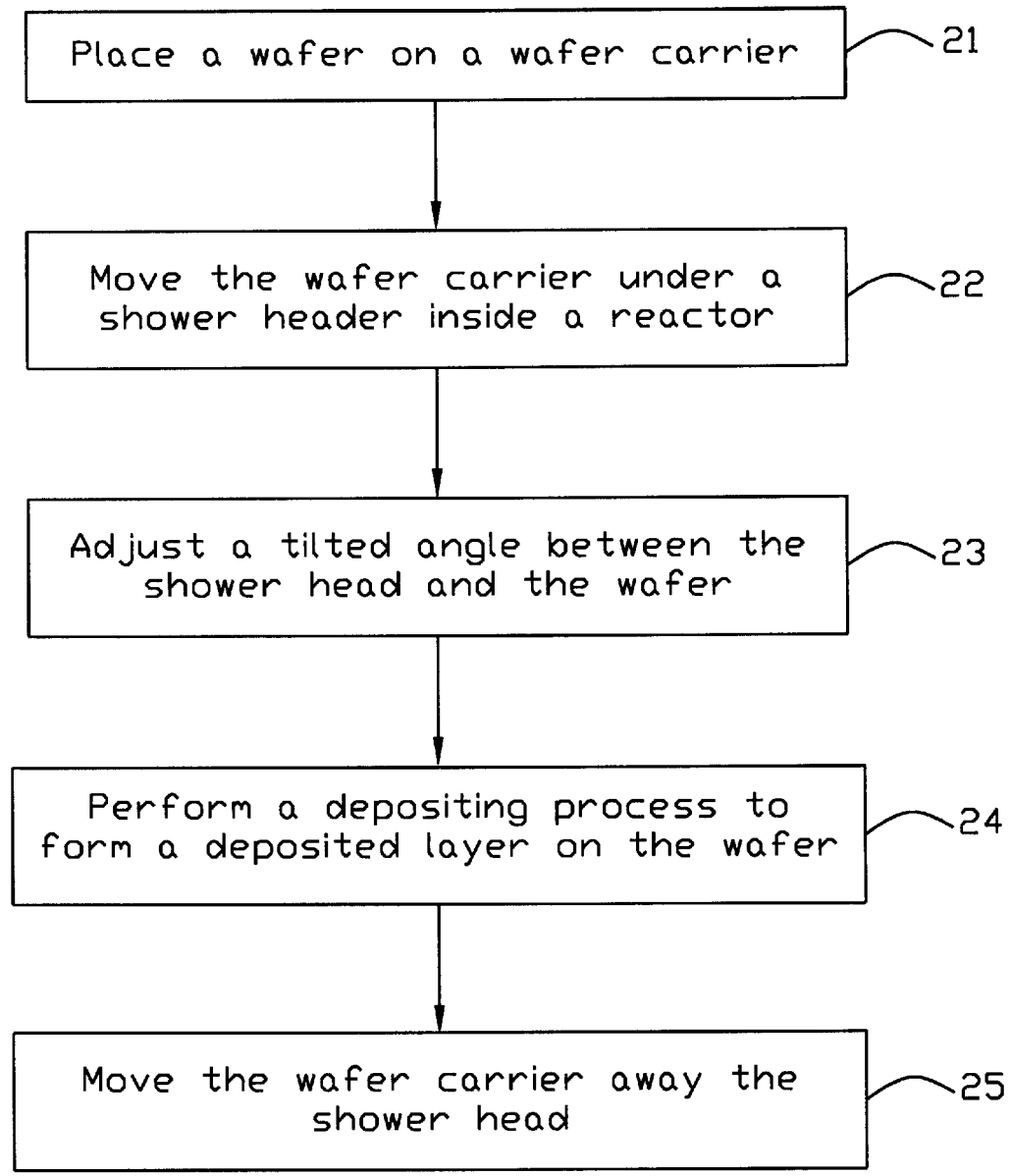
FIG. 2 is a compendious flow diagram of a method for modulating uniformity of deposited layer thickness, the present method being one preferred embodiment of the invention.

One preferred embodiment of the proposed invention is a method for modulating uniformity of deposited layer thickness. As shown in FIG. 2, the present method comprises the following essential steps: First of all, as first blocks 21 shows, a wafer is placed on a wafer carrier. Then, as second block 22 shows, the wafer carrier is moved under a shower head that is inside a reactor. And then, as third block 23 shows, a tilted angle is adjusted between the shower head and the wafer (or the wafer carrier, if the wafer carrier is parallel to the wafer). Moreover, as fourth blocks 24 shows, a depositing process is performed to form a deposited layer on the wafer. Finally, as block 25 shows, the wafer carrier is moved away from the shower head.

In addition, the wafer comprises a plurality of semifinished chips, each semifinished chip including some structures on it, such as isolation and gate, and is required to form a deposited layer on these structures. Further, owing to the fact that the deposition process requires heat typically several hundred degrees centigrade are necessary), the wafer carrier can be further located on a heater block that is used to provide required heat during following depositing process.

Moreover, in third block 23, the tilted angle is adjusted by rotating the shower head. The shower head is connected to an immobile structure by several stretch devices that are stretched or shrunk individually to rotate the shower head, where an available immobile structure comprises the reactor. Of course, the titled angle also can be adjusted by rotating the wafer carrier. However, because rotation of the wafer carrier strongly affects all reaction on the wafer, it is better to adjust the title angle by rotating the shower head.

Figure 3A:
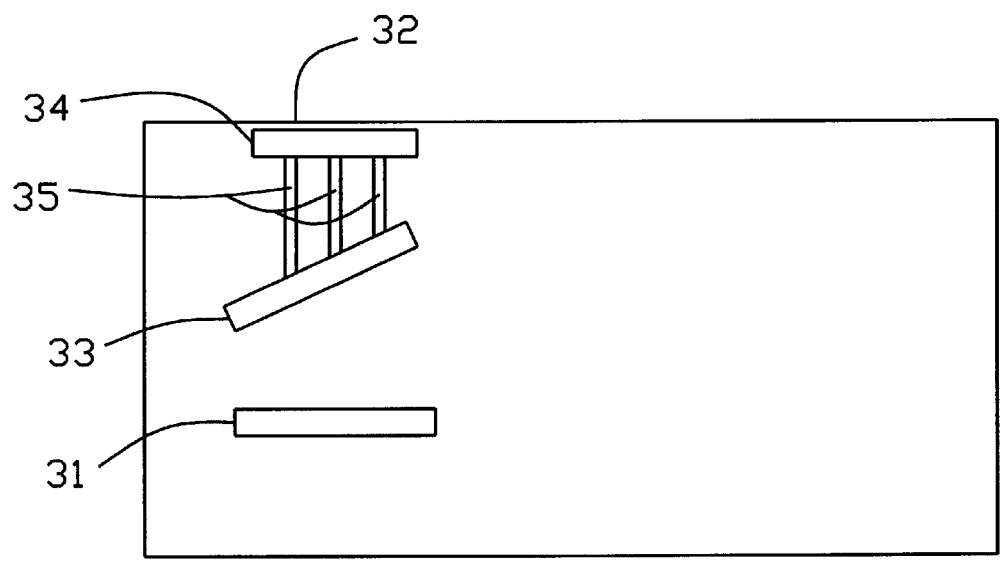
FIG. 3A and FIG. 3B illustrate how the tilted angle between the wafer and the head shower is adjusted by the presented invention.
Figure 3B:
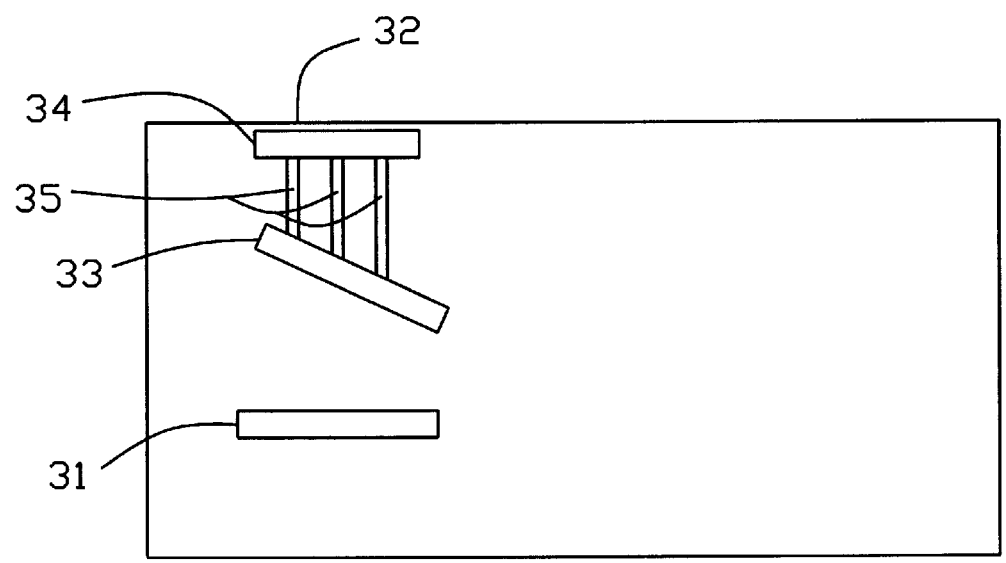

Furthermore, as shown in FIG. 3A, when wafer 31 is not is located at the center of reactor 32, the tilted angle can be adjusted to let the distance between near side of shower head 33 and the near side of wafer 31 be larger than the distance between the far side of shower head 33 and the far side of wafer 31. Further, as FIG. 3B shows, the tilted angle also can be adjusted to let the distance between near side of shower head 33 and the near side of wafer 31 be smaller than the distance between the far side of shower head 33 and the far side of wafer 31. Herein, the near side is near to the center of the reactor and the far side is far away from the center of the reactor. Moreover, FIG. 3A and FIG. 3B show that though shower head 33 is connected to the immobile structure 34 by several stretch structures 35 as provided in a conventional depositing machine, but in the proposed invention the tilted angle is properly adjusted by stretching or shrinking each stretch structure individually which is obvious and significant by comparing FIG. 3A to FIG. 3B Certainly, when wafer 31 is located at the center of reactor 32, there is no difference between the near side and the far side. But the method also is useful for it also can overcome the trouble that distribution of showing the rate of reacting the elements is not uniform over the surface of shower head 33 and then the thickness of deposited layer is not uniform.

Additionally, the depositing process can be a chemical vapor deposition process or a physical vapor deposition process. Particularly, because non-uniformity is more obvious for plasma enhanced chemical vapor deposition, the depositing process includes the plasma enhanced chemical vapor depositing process. Further, available materials of the deposited layer comprise dielectric, oxide or silicon nitride. Beside these stretch devices also can be used to adjust both the relative position and the distance between the wafer and the shower head before the depositing process, which serves an equivalent function as a conventional depositing machine with a shower head.

According to the previous discussion, when the reacting environment results in the depositing rate being not uniform over wafer 31, the present method can overcome it by adjusting the tilted angle to modulate distribution of the depositing rate. In other words, the effect of the reacting environment is balanced by a variation of tilted angle. However, it should be observed that the relation between tilted angle and reacting environment is complicated. For example, when material of the deposited layer is an oxide, shower head 33 should be tilted outward to balance the effect of the reacting environment. But when material of the deposited layer is silicon oxide, shower head 33 should be tilted inward to balance the effect of the reacting environment. In summary, the tilted angle is dependent on the material of the deposited layer.

Figure 4:
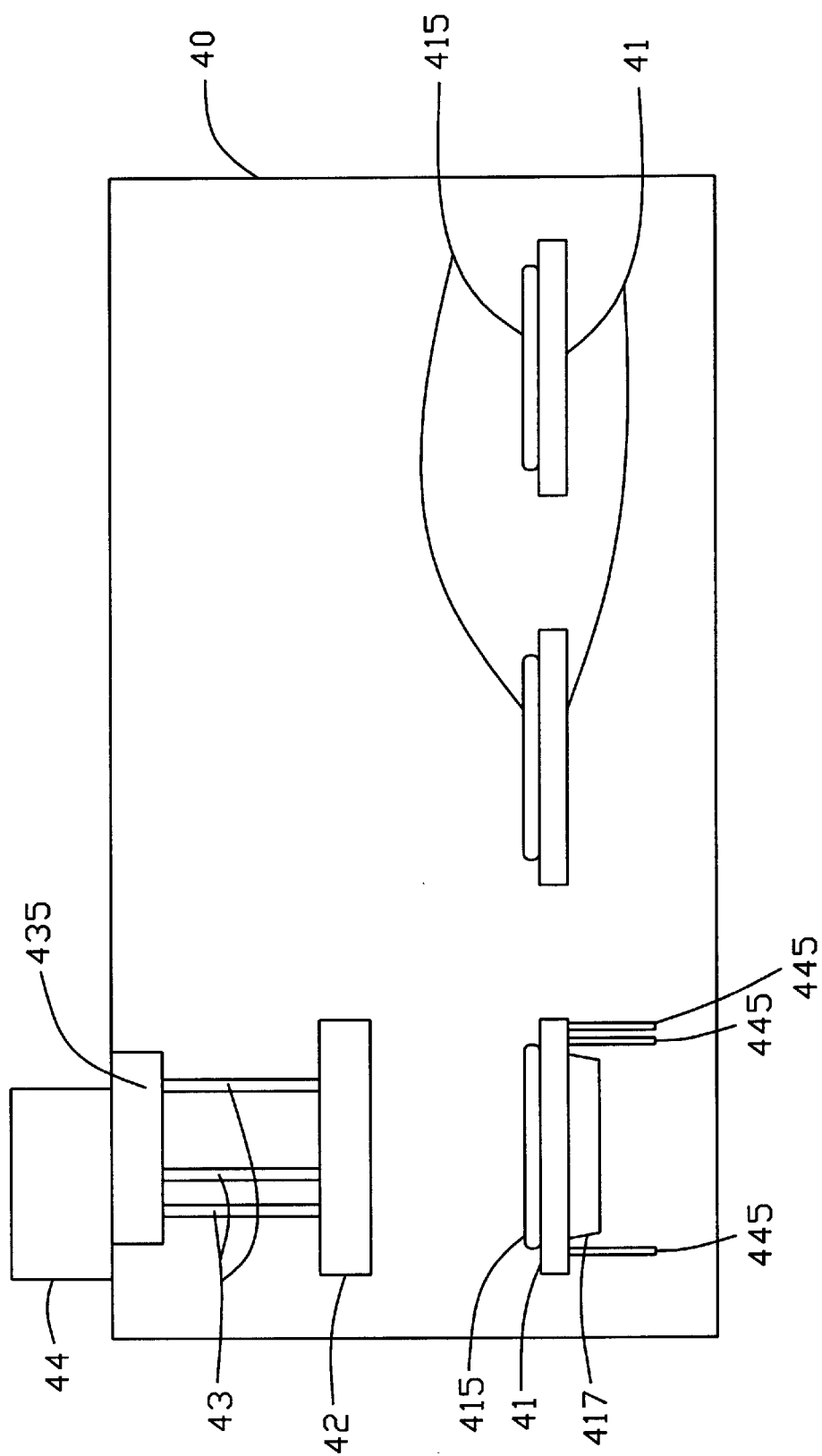
FIG. 4 is a compendious cross-section illustration of an apparatus for modulating uniformity of deposited layer thickness, the present apparatus being another preferred embodiment of the invention.

Another preferred embodiment of the present invention is an apparatus for modulating uniformity of deposited layer thickness. As shown in FIG. 4, the present apparatus comprises the following essential elements: Reactor 40, wafer carrier 41, shower head 42, stretch devices 43 and reacting devices 44.

In short, when reactor 40 is a single wafer type reactor, there is only one wafer 415, one wafer carrier 41 and one shower head 42 inside reactor 40. When reactor 40 is a batch type reactor, there are several wafers 415, several wafer carriers 41 and several shower holders 42 inside reactor 40. But for most current reactors, number of shower heads 42 is less than the number of wafer carriers 41 when the number of wafers 415 is equal to the number of wafer carriers 415. Specifically, FIG. 4 illustrates the batch type reactor having three wafers 415 and three wafer carriers inside.

Reactor 40 is used to let a depositing process be performed inside it.

Wafer carrier 41 is used to hold wafer 415 and position wafer 415. Where wafer 415 comprises a plurality of semifinished chips, and each semifinished chip includes some structures, such as isolation and gates, on it and is required to form a deposited layer it. And wafer carrier 41 is used to move wafer 415 under the shower head 42 before the depositing process and to move wafer 415 away from the shower head 42 after the depositing process. Further, owing to the fact that heat is required by the depositing process regardless of whether the deposition is chemical vapor deposition or physical vapor deposition, wafer carrier 41 usually is located on heater block 417 that is used to heat wafer 415.

Shower head 42 is used to shower a number of reacting elements on wafer 415. As illustrated, shower head 42 is located over wafer 415 when a depositing process is performed.

Stretch devices 43 are used to connect shower head 42 to immobile structure 435, where available immobile structure 435 includes reactor 40. Stretch devices 43 are stretched or shrunken individually to rotate shower head 42 and to adjust a tilted angle between shower head 42 and wafer carrier 41. Because a basic mathematical principle tells that a plane is decided by three points that do not locate on same line. A perspicuous and useful type of stretch devices 43 is where the stretch devices 43 are provided by three stretch rods. This is more controllable when connections between these stretch rods and shower head 42 forms an equilateral triangle.

Furthermore, the tilted angle can be adjusted to let the distance between the near side of shower head 42 and the near side of wafer 415 be larger than the distance between the far side of shower head 42 and the far side of wafer 415. Where the near side is near the center of reactor 40 and the far side is far away from the center of reactor 40. On the other hand, the tilted angle also can be adjusted to let the distance between the near side of shower head 42 and the near side of wafer 415 be smaller than the distance between the far side of shower head 42 and the far side of wafer 415.

Reacting devices 44 are used to perform the depositing process and form a deposited layer on wafer 415, where reacting devices 44 comprise a power supply and a gas source.

In addition, the tilted angle can be adjusted by either rotating wafer 415 or rotating shower head 42. The proposed apparatus further comprise some additional stretch devices 445 for rotating wafer carrier 41 to adjust the tilted angle. Both stretch devices 43 and additional stretch devices 445 can be used to adjust both the relative position and the distance between wafer 415 and shower head 42. Further, available varieties of the depositing process comprises chemical vapor deposition process, especially the plasma enhanced chemical vapor depositing process. And material of the deposited layer comprises oxide, silicon nitride and dielectric.

Incidentally, when plasma enhanced chemical vapor deposition is performed by the presented apparatus, and material of the deposited layer is oxide, it is necessary to let the distance between the near side of the shower head and the near side of the wafer be larger than the distance between the far side of the shower head and the far side of the wafer. In comparison, when plasma enhanced chemical vapor deposition also is performed by the presented apparatus, and material of the deposited layer is silicon nitride, it is necessary to let the distance between near side of the shower head and the near side of the wafer be smaller than the distance between the far side of the shower head and the far side of wafer.

Obviously, numerous additional modifications and variations of the present invention are possible in light of the above teachings. It is therefore to be understood that within the scope of the appended claims, the invention may be practiced otherwise than as specifically described herein.

What is claimed is:

1. A method for modulating uniformity of deposited layer thickness, said method comprising:

placing a wafer on a wafer carrier;

moving said wafer carrier under a shower head, wherein said shower head is inside a reactor;

adjusting a tilted angle between said shower head and said wafer;

performing a depositing process to form a deposited layer on said wafer; and moving said wafer carrier away said shower head.

2. The method according to claim 1, wherein said wafer comprises a plurality of semifinished chips.

3. The method according to claim 1, wherein said wafer carrier is located on a heater block that is used to heat said wafer.

4. The method according to claim 1, wherein said tilted angle is adjusted by rotating said shower head.

5. The method according to claim 1, wherein said tilted angle is adjusted by rotating said wafer.

6. The method according to claim 1, wherein said shower head is connected to an immobile structure by a plurality of stretch devices.

7. The method according to claim 6, wherein said immobile structure comprises said reactor.

8. The method according to claim 6, wherein said stretch devices are stretched or shrunk individually to rotate said shower head.

9. The method according to claim 1, wherein said tilted angle is adjusted to let the distance between near side of said shower head and near side of said wafer is larger than the distance between far side of said shower head and far side of said wafer, wherein the near side is near to the center of said reactor and the far side is far away the center of said reactor.

10. The method according to claim 1, wherein said tilted angle is adjusted to let the distance between near side of said shower head and near side of said wafer is smaller than the distance between far side of said shower head and far side of said wafer, wherein the near side is near to the center of said reactor and the far side is far away the center of said reactor.

11. The method according to claim 1, wherein said depositing process comprises chemical vapor deposition process.

12. The method according to claim 1, wherein said depositing process comprises physical vapor deposition process.

13. The method according to claim 1, wherein said depositing process comprises plasma enhanced chemical vapor depositing process.

14. The method according to claim 1, wherein said deposited layer comprises oxide layer.

15. The method according to claim 1, wherein said deposited layer comprises silicon nitride layer.

16. The method according to claim 1, wherein said deposited layer comprises dielectric layer.

17. The method according to claim 1, further comprising both the relative position and the distance between said wafer and said shower head are adjusted before said depositing process.

\* \* \* \* \*